United States Patent
Simpson

(10) Patent No.: US 11,156,690 B2
(45) Date of Patent: Oct. 26, 2021

(54) MEASUREMENT SYSTEM CONFIGURED FOR MEASUREMENTS AT NON-CALIBRATED FREQUENCIES

(71) Applicant: Maury Microwave, Inc., Ontario, CA (US)

(72) Inventor: Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 342 days.

(21) Appl. No.: 16/129,415

(22) Filed: Sep. 12, 2018

(65) Prior Publication Data
US 2019/0086503 A1 Mar. 21, 2019

Related U.S. Application Data

(60) Provisional application No. 62/559,455, filed on Sep. 15, 2017.

(51) Int. Cl.
*G01R 35/00* (2006.01)
*G01R 27/28* (2006.01)
*G01R 27/32* (2006.01)
*G01R 31/28* (2006.01)

(52) U.S. Cl.
CPC .......... *G01R 35/005* (2013.01); *G01R 27/28* (2013.01); *G01R 27/32* (2013.01); *G01R 31/2822* (2013.01)

(58) Field of Classification Search
CPC ...... G01R 35/005; G01R 27/32; G01R 27/28; G01R 31/2822
See application file for complete search history.

(56) References Cited

U.S. PATENT DOCUMENTS

| | | | |
|---|---|---|---|
| 8,912,861 B1* | 12/2014 | Tsironis | H01G 5/06 333/32 |
| 9,614,693 B2 | 4/2017 | Simpson | |
| 9,625,556 B1 | 4/2017 | Tsironis | |
| 9,632,124 B2 | 4/2017 | Simpson | |
| 9,647,629 B1* | 5/2017 | Tsironis | H03H 7/38 |
| 9,964,580 B2 | 5/2018 | Boudiaf et al. | |
| 2003/0171886 A1 | 11/2003 | Hill et al. | |
| 2006/0279275 A1* | 12/2006 | Simpson | G01R 27/04 324/750.16 |

(Continued)

OTHER PUBLICATIONS

T. Roeder, Using S-Parameters with R&S NRP-Z Power Sensors, Jul. 24, 2012 (Jul. 24, 2012), 27 pages, Retrieved from the Internet: URL:https://cdn.rohde-schwarz.com/pws/dl_downloads/dl_application/application_notes/1gp70/1GP70_0E.pdf [retrieved on Dec. 7, 2018].

(Continued)

*Primary Examiner* — Christopher P McAndrew
*Assistant Examiner* — Zannatul Ferdous
(74) *Attorney, Agent, or Firm* — Larry K. Roberts

(57) ABSTRACT

A tuner system for conducting measurements on a Device Under Test (DUT) includes at least one passive tuner, and calibration data for the at least one passive tuner including a set of s-parameters at a set of calibration frequencies. A measurement on the DUT is done at a measurement frequency at which the at least one passive tuner is not calibrated. The tuner s-parameters at the measurement frequency are determined by interpolation between or extrapolation from the s-parameters at calibration frequencies.

6 Claims, 11 Drawing Sheets

(56) References Cited

U.S. PATENT DOCUMENTS

| | | | |
|---|---|---|---|
| 2007/0194776 A1* | 8/2007 | Bossche | G01R 27/28 |
| | | | 324/76.22 |
| 2010/0301875 A1* | 12/2010 | Roff | G01R 27/30 |
| | | | 324/629 |
| 2013/0321092 A1 | 12/2013 | Simpson | |
| 2015/0117506 A1* | 4/2015 | Simpson | H01P 1/18 |
| | | | 375/228 |
| 2016/0124032 A1 | 5/2016 | Simpson | |

OTHER PUBLICATIONS

Ghannouchi et al., "Source-Pull/Load-Pull Oscillator Measurements at Microwave/MM Wave Frequencies," IEEE Transactions on Instrumentation and Measurement, vol. 41, No. 1, Feb. 1, 1992, pp. 32-35.

International Search Report and Written Opinion for International Application PCT/US2018/051052; dated Dec. 14, 2018.

\* cited by examiner

MEASUREMENT SYSTEM CONFIGURED FOR MEASUREMENTS AT NON-CALIBRATED FREQUENCIES

CROSS-REFERENCE TO RELATED APPLICATIONS

This application claims the benefit of U.S. Provisional Application No. 62/559,455, filed Sep. 15, 2017, the entire contents of which application are hereby incorporated by reference.

BACKGROUND

Passive load pull systems have been widely used to characterize microwave devices. Load pull involves measuring a Device Under Test (DUT) under controlled conditions, including controlled impedances seen by the DUT. The controlled impedances may include the impedance on any port of the DUT, and they may be at the fundamental operating frequency or at a harmonic frequency. A typical load pull measurement would measure the DUT performance at multiple impedances to show the effect of impedance on the DUT performance. Some other conditions that may be controlled and/or varied include frequency, power level, bias values, or temperature. In this document, load pull means any measurement system that includes impedance tuning, including power measurements or noise measurements.

In this document, impedance, reflection, or reflection coefficient are all used as general terms to describe the RF termination seen at an RF port. They are functions of the signal coming out of an RF port and the signal at the same frequency coming into the port. Reflection coefficient is related to impedance by the expression $$Z = \frac{(1+\Gamma)}{(1-\Gamma)}$$

where Z is the impedance and r is the reflection coefficient. Both terms contain the same information, so that if one is known, the other is also known. Therefore, in this document they will be used interchangeably. Also, the terms "RF port" and "reference plane" are used interchangeably in the context of impedance control.

Impedance tuners are commonly used in load pull measurement systems working at radio frequency (RF), microwave (MW) frequencies, and millimeter-wave frequencies. In this document, RF will mean the entire spectrum of frequencies, including microwave frequencies, millimeter-wave frequencies, and higher.

An impedance tuner may include a transmission line, such as a slabline, coaxial or waveguide line. Placement of capacitive objects such as probes along the transmission line alters the impedance or electronic profile seen by the DUT which is connected or coupled to the tuner transmission line. The object may be moved axially along the transmission line to affect the phase, while movement of the object transverse to the transmission line will alter impedance magnitude or reflection effects. In automated tuners a motor is used to position the capacitive objects along the transmission line and transverse to the transmission line.

A "passive RF component" does not require energy to operate, except for the available AC circuit it is connected to. A "passive RF module" is incapable of power gain and is not a source of energy. A passive impedance tuner is one where the RF portion of the tuner consists entirely of passive components, so that the tuner itself is also a passive component.

The RF portion of a tuner is the portion containing the RF signal paths, in which RF signals may be present. Passive impedance tuners may control impedance by moving passive objects, such as a capacitive probe, in a passive transmission line. They may also control impedance with solid state switches, which are passive components.

Active tuning load pull systems have also been used, but not as widely because of the complexity and cost. Active tuning provides some advantages, including capability to present a higher reflection coefficient than is possible with a passive tuning system, even with fixture losses or other circuit losses. The impedance seen by the DUT can be all the way to the edge of the Smith chart, and even outside the Smith chart, if desired.

In this document, a "tuner system" will refer to a RF measurement system which uses some kind of tuner or tuners to control impedance at a reference plane or planes, e.g. an impedance seen by a DUT.

An "automated tuner" may be computer controlled; a "manual tuner" is controlled manually by the user.

A "passive tuner" controls the impedance at a reference plane with a passive reflection. This means that it reflects a portion of a signal coming out of a port back into that port. It controls the magnitude or phase of the reflected signal by changing RF hardware settings. The maximum reflection is limited by the physical hardware and losses between the tuner and the DUT reference plane.

A passive tuner may be automated with electronic control, but the control circuits are not part of the RF signal path(s). Therefore, electronic control circuits, electric motors, electronic interfaces, and any other aspect of the tuner outside of the RF portion of the tuner do not change the fact that the tuner is passive.

An "active tuner" controls an impedance at a reference plane by feeding a signal back to that reference plane with a specific magnitude and phase relative to the signal from that reference plane. In the context of conducting measurements on a DUT, the active tuner controls the impedance seen by the DUT by feeding a signal back to the DUT with a specific magnitude and phase relative to the signal from the DUT. It would normally use a signal that is either generated or amplified external to the DUT. The active tuner is said to be operating, or controlling the impedance, at the frequency of the "active" signal. In principle, the maximum effective reflection can be up to or even greater than unity. In practice, this is limited by the amount of power generated by the measurement system that can be fed back to the DUT to synthesize that impedance.

In this document, a "passive tuner system" means a measurement system using passive tuners, with no active tuners. An "active tuner system means a measurement system with active tuning, and no passive tuners. A "hybrid tuner system" means a measurement system that uses both passive tuners and active tuning.

A "noise parameter system" is a system that is setup to measure the noise parameters of a DUT. Typically, noise parameter systems use at least one passive tuner on the source side (input) of the DUT, and sometimes a passive tuner on the load side (output) of the DUT.

In this document, "calibration" or "characterization" of components of the measurement system will be used interchangeably to mean the same thing. Examples of components of the measurement system include impedance tuners, bias tees, RF switches, RF sources, RF receivers, and any other component that affects the RF signal, with the exception of the DUT.

In the prior art, passive tuners have been calibrated by measuring the tuner's 2-port s-parameters at a fundamental center frequency. From the 2-port s-parameters, the 1-port reflection coefficient seen by the DUT can be known. In some cases, the tuner calibration may consist of measuring the 1-port reflection coefficient at the fundamental frequency directly. Although one tuner calibration may cover many fundamental frequencies, they are only used one frequency at a time.

A limitation in the prior art of tuner systems that use passive tuners is that the measurement has been restricted to the calibration frequencies. If a measurement is desired at a different frequency that is not in the list of calibrated frequencies, a new calibration of the measurement system is required at the new frequency before the measurement can be done.

This invention introduces a method of calibration and measurement that allows calibrated frequencies to be extended to allow measurements at frequencies that were not in the list of calibrated frequencies.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

Figure 1:
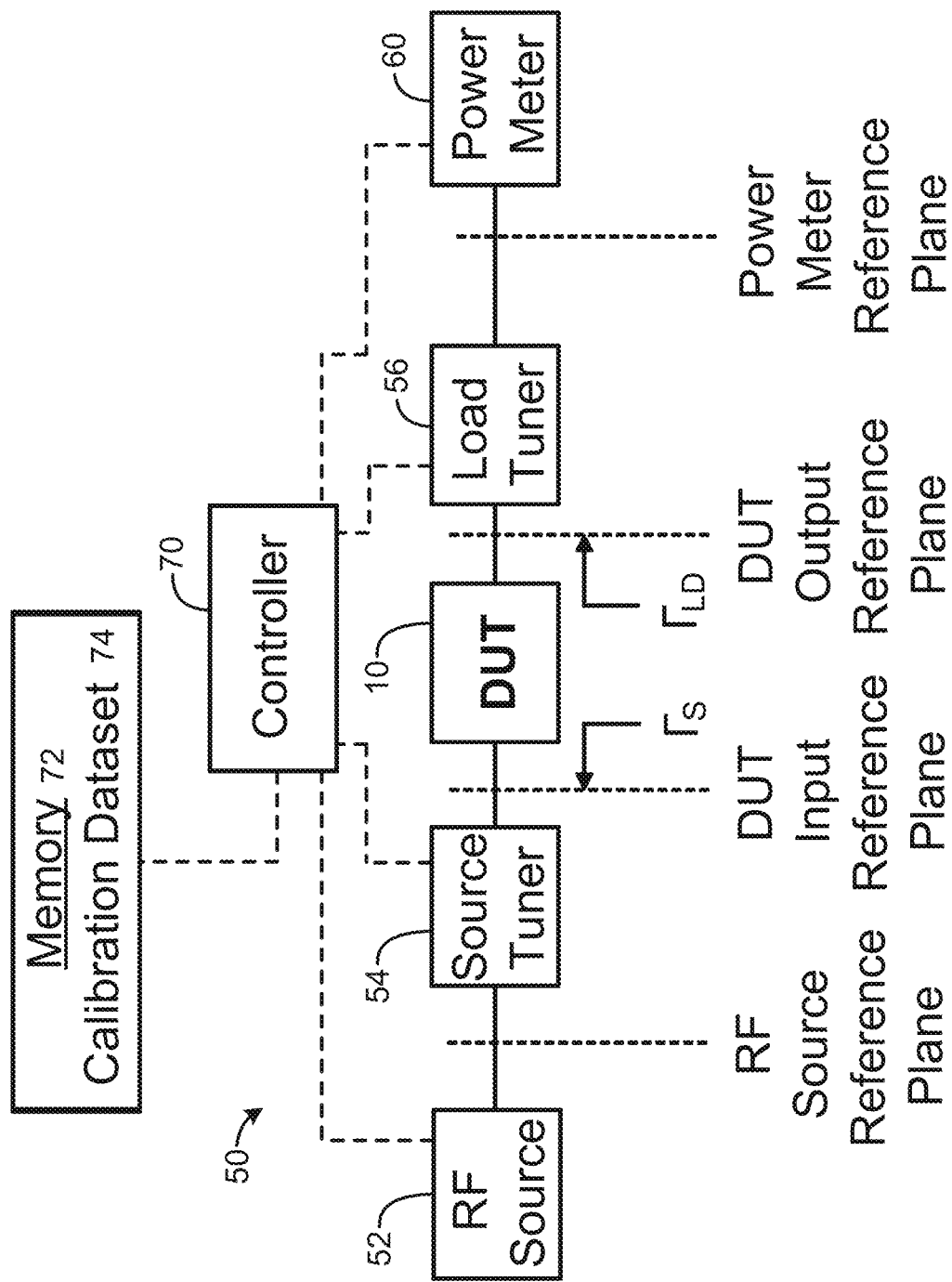
FIG. 1 shows a block diagram of a basic tuner system for making power measurements on a DUT.

In the following detailed description and in the several figures of the drawing, like elements are identified with like reference numerals. The figures are not to scale, and relative feature sizes may be exaggerated for illustrative purposes.

FIG. 1 shows a block diagram of the RF signal path in a basic tuner system for making power measurements on a DUT. The RF source 52 generates a signal to drive the DUT 10 input. Between the RF source and the DUT input port is the source tuner 54, which can be adjusted (typically under software control by controller 70) to set the impedance $\Gamma_S$ seen by the DUT input port. Connected to the DUT output port is the load tuner 56, which can be adjusted (typically under software control by controller 70) to set the impedance $\Gamma_{LD}$ seen by the DUT output port. Finally, after the load tuner is the measurement device 60 which, in one embodiment may be a power meter to measure the output power. The measured output power is de-embedded through the s-parameters of the load tuner to get the actual delivered output power at the DUT plane for any given setting of the load tuner. The controller 70 can perform the de-embedding. A memory 72 stores calibration data sets 74 for the RF components of the system, including the source tuner 54 and the load tuner 56. In other embodiments, the measurement device 60 may be a network analyzer, a noise figure meter or a spectrum analyzer.

Figure 2:
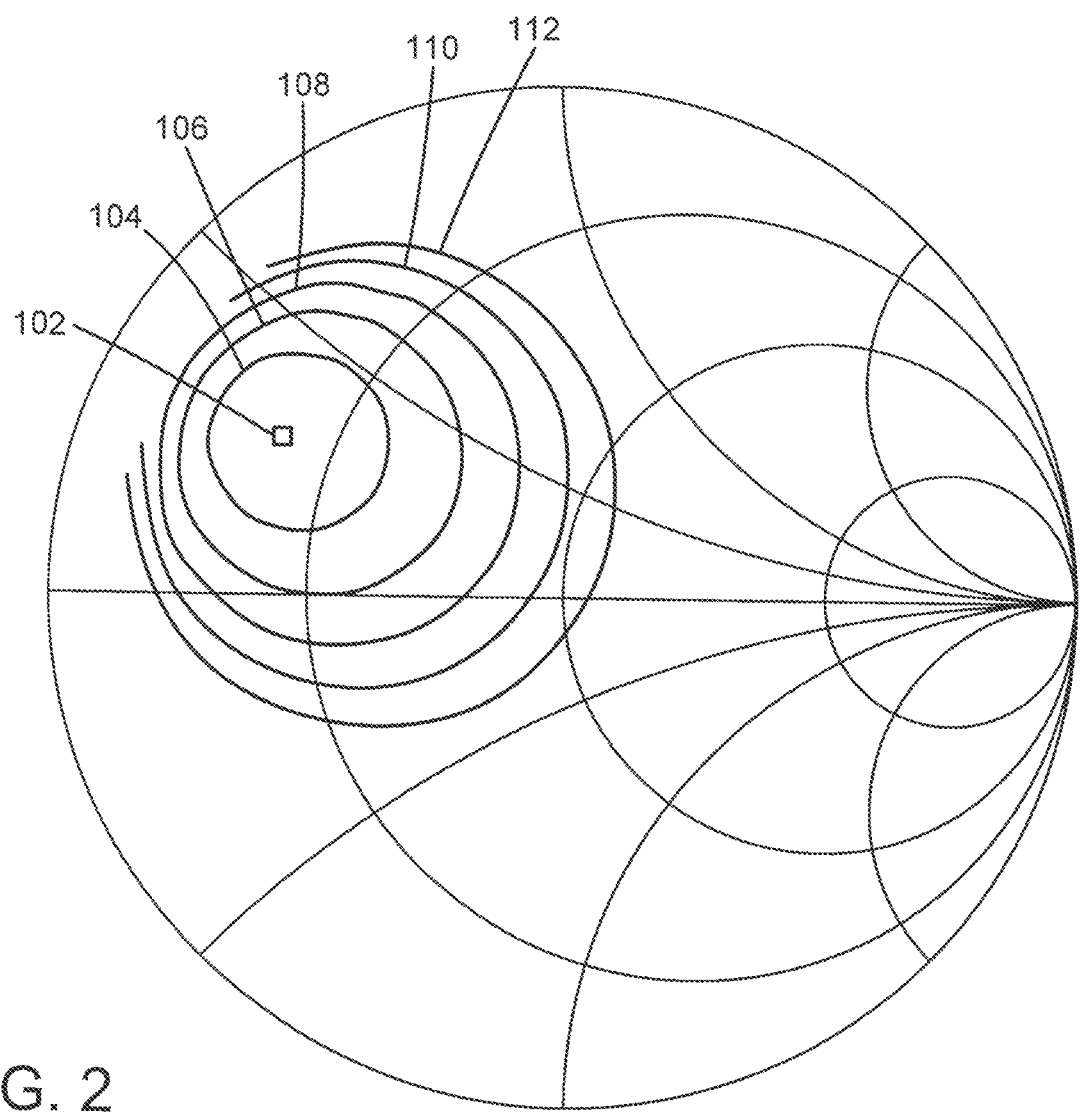
FIG. 2 shows a set of contours of data taken with a tuner system for making power measurements on a DUT.

FIG. 2 shows a set of output power contours from data measured with the basic tuner system of FIG. 1. They show how output power varies as a function of impedance. The contours are plotted on a Smith chart, which is a two-dimensional graph of impedance, well known in the art. Contours of many different parameters can be measured and shown in a similar way, so output power is just an example.

The small square 102 in FIG. 2 is plotted at the impedance that provides the maximum output power, also called the optimum impedance (for output power). As the impedance presented to the DUT moves away from the optimum in any direction, the output power will decrease. The closest contour surrounding the optimum shows the set of impedances where the output power is decreased from the optimum by 0.5 dB. Each succeeding contour 104, 106, 108, 110, 112 farther from the optimum shows the set of impedances where the output power is decreased by an additional 0.5 dB from the prior contour.

The data plotted in FIG. 2 was taken with a signal from the RF source applied to the DUT input. The tuner s-parameters were calibrated at that frequency, so the impedances presented to the DUT ports are known at that frequency. The de-embedding of the output power measured at the power meter reference plane to the DUT output reference plane used the same calibrated tuner s-parameters, so the output power at the DUT output reference plane was correctly known.

To measure the data shown in FIG. 2, the load tuner was moved to an impedance (known from the calibration), and the output power resulting from that load impedance measured with the power meter and de-embedded to the DUT output reference plane. This was then repeated for multiple load impedances corresponding to different load tuner calibrated settings. After all of the power measurements at the various impedances are complete, the output power variation due to load impedance change is known (from prior art methods) and the contours may be drawn.

Changing the measurement frequency to another calibrated frequency is straight forward. The frequency is changed on the RF source, and the software uses the calibration data for the new frequency.

Figure 3:
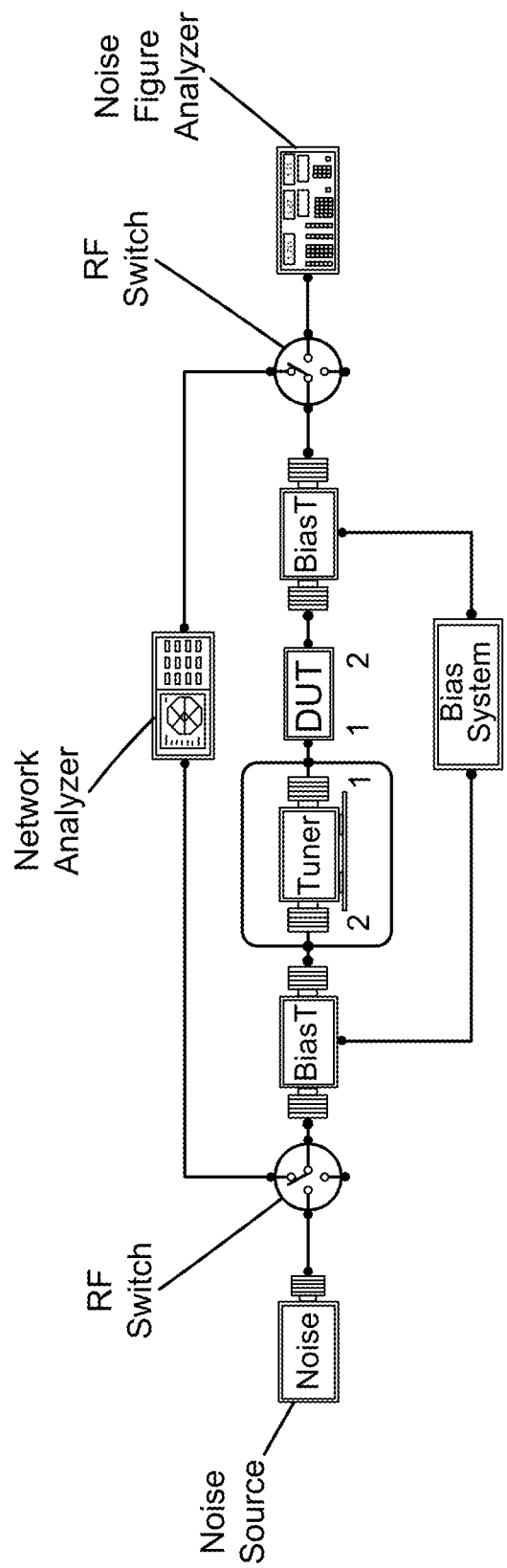
FIG. 3 shows a block diagram of a tuner system for making noise parameter measurements on a DUT.

FIG. 3 depicts a noise measurement setup for a device under test (DUT), and includes a noise source connected to one port of RF switch. A network analyzer is connected to another port of the RF switch. The RF switch is also connected through a bias T to a port of impedance tuner. The RF switch can be set to connect the network analyzer to the tuner, or the noise source to be connected to the tuner. One port of the DUT is connected to a second port of the tuner. A second bias T is connected to a second port of the DUT. The bias system is connected to the bias Ts. An RF switch is connected between the network analyzer, the bias T and a noise receiver or noise figure analyzer, with the switch allowing signals from the bias T to be passed to the network analyzer or the noise figure analyzer.

Noise parameters typically include a set of values that describe how the noise figure of a device varies with impedance match. The noise parameters generally vary with conditions associated with a device-under-test (DUT), such as frequency, bias, or temperature. There are different forms of the noise parameters, but generally may include a set of four (4) scalar values. A commonly used set is:
1. Fmin=minimum noise figure
2. Gamma_opt magnitude=magnitude of gamma_opt, the optimum source gamma that will produce Fmin
3. Gamma_opt phase=phase of gamma_opt, the optimum source gamma that will produce Fmin
4. rn=equivalent noise resistance, which determines how fast the noise figure will change as the source gamma moves away from Gamma_opt.

Figure 4:
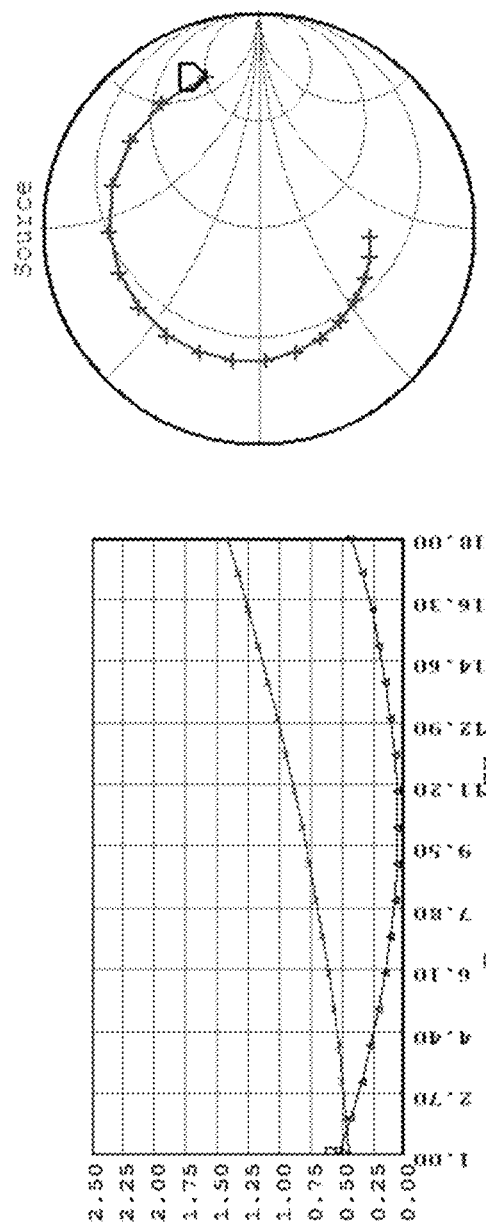
FIG. 4 shows a plot of typical noise parameter data taken with a tuner system for making noise parameter measurements on a DUT.

FIG. 4 shows a display of measured noise parameters of a DUT using the system of FIG. 3. Fmin versus frequency and rn versus frequency are displayed in the rectangular plot, and Gamma_opt versus frequency is displayed in the Smith chart plot.

The limitation of the prior art is that it is not possible to change to a new frequency that was not calibrated, even if the new frequency is sandwiched very close between calibrated frequencies.

To use calibration data at an uncalibrated frequency requires interpolation or extrapolation. Interpolation is moving to a frequency between existing calibrated frequencies. Extrapolation is moving to a frequency that is outside the calibrated frequency range. Interpolation and extrapolation versus frequency have not been used with passive tuners. The challenge of interpolation or extrapolation vs frequency with passive tuners is that there is not just one value at each frequency, but many states at each frequency. And the calibration data for each state consists of four complex numbers (the s-parameters) which comprises eight real numbers. So a specific method is needed to interpolate (or extrapolate) vs. frequency with passive tuners. This could save calibration time and reduce the amount of calibration data that needs to be stored.

To simplify the text, the following discussion will be about interpolation only. A discussion of extrapolation will follow.

This new method has two approaches to interpolation: a) numeric interpolation and b) model-based interpolation.

Figure 5:
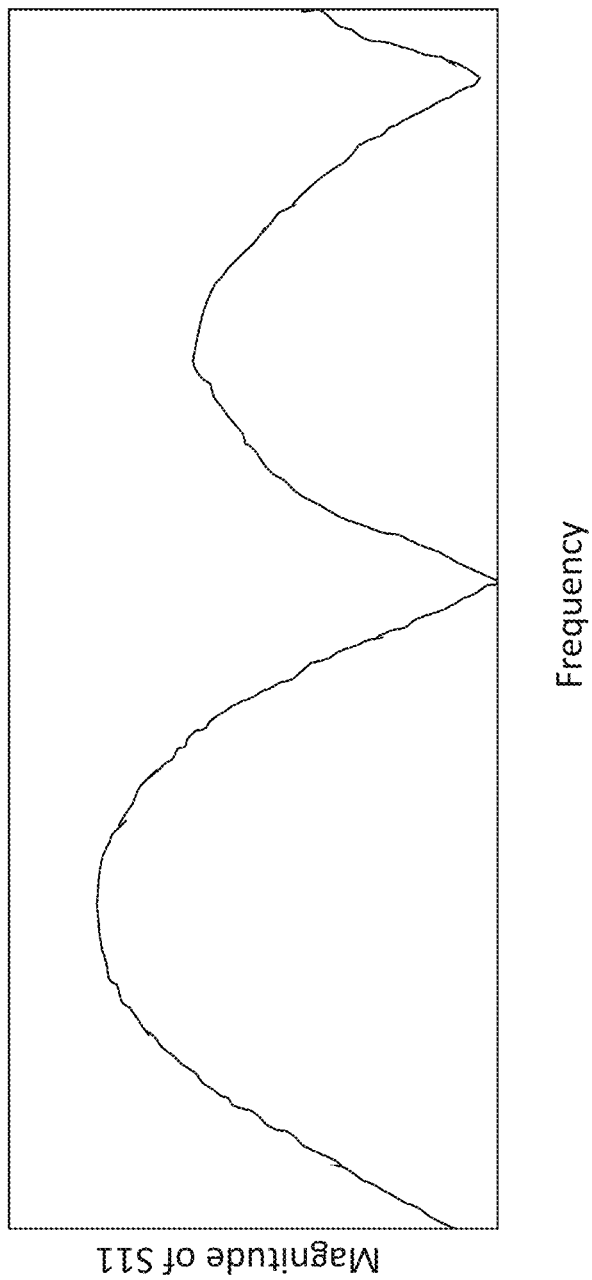
FIG. 5 shows a typical plot of the reflection magnitude response, in this case the magnitude of s parameter $S_{11}$, of a tuner vs. frequency.

Numeric interpolation will interpolate on every parameter vs. frequency separately. For every calibrated tuner state, there are four complex numbers, called s11, s21, s12, and s22, where each comprises two real numbers, and the four complex numbers together are called the s-parameters. Each complex number (one s-parameter) can be expressed as a magnitude and phase pair, or as a real and imaginary pair. The two forms contain the same information, and if one form is known, the other is known using the following equations:

$x = mag * cos(phase)$ $y = mag * sin(phase)$ or $mag = \sqrt{(x^2 + y^2)}$ $phase = arcTan(y, x)$ where x is the real part and y is the imaginary part The magnitude and phase pair of give good insight about how the tuner is working, but complicates the interpolation. For one thing, phase becomes meaningless when magnitude goes to zero or near zero. This happens at some frequencies as shown in FIG. 5 in which an exemplary magnitude of s11 is plotted as a function of frequency. Also, phase goes from zero to 360 degrees, then starts over at zero degrees again. In fact, zero and 360 degrees represent exactly the same value. This creates a discontinuity that will disturb the interpolation. Some tricks can be used, such as linearizing the phase by adding an additional 360 degrees every time the discontinuity is crossed as frequency is changed. Another trick that may work if the phase range is not too large is to move the discontinuity to another phase value such as plus or minus 180 degrees.

Figure 6:
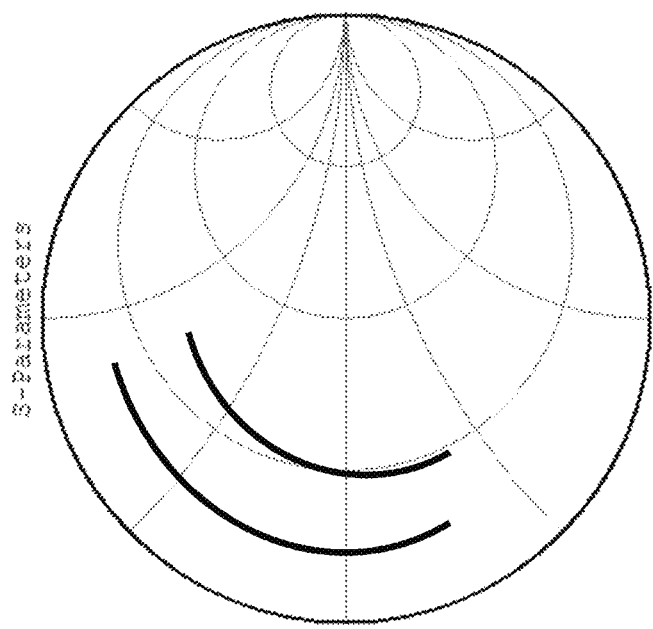
FIG. 6 shows a typical real and imaginary pair response of two tuner states vs. frequency.

A simpler approach is to do the interpolation using the real and imaginary pair version of each complex number. This eliminates discontinuities and both values are always significant. This breaks the numeric interpolation down to a simple interpolation vs. frequency of eight real numbers for every tuner state. A typical real and imaginary pair response is shown in FIG. 6. The parameters of a passive tuner will always stay within the unit circle, so the plot is limited to a circle. On the plot, the real value (or x value) goes from −1 at the left to +1 at the right. The imaginary value (or y value) goes from −1 at the bottom to +1 at the top. The values at the center of the circle are zero for both parameters.

Interpolation of a real number vs. frequency is a known mathematical procedure. Linear interpolation assumes a straight line between two surrounding frequency points. Higher order interpolation could use the two surrounding points plus some additional closest points vs. frequency to account for curvature vs. frequency. Another known example is using a spline fit for the interpolation.

Figure 7:
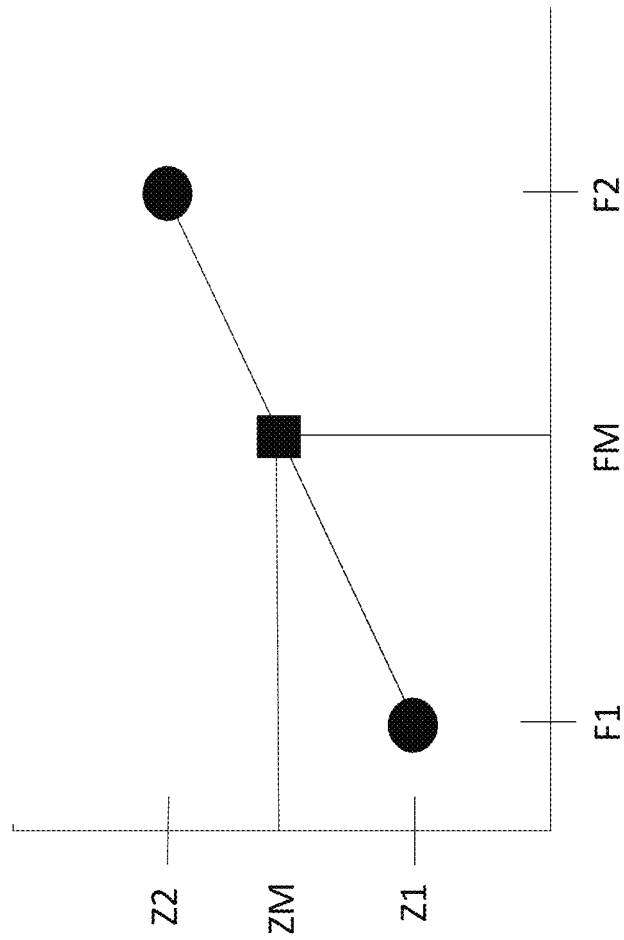
FIG. 7 shows an example of linear interpolation.

FIG. 7 shows an example of linear interpolation. If Z1 is the calibrated value at frequency F1, and Z2 is the calibrated value at frequency F2, then ZM is the interpolated value for frequency FM. This can be calculated with the following equation:

$$ZM = Z1 + \frac{(FM - F1)(Z2 - Z1)}{(F2 - F1)}$$

For frequency ranges where the tuner response vs. frequency is smooth, the numeric interpolation method can work well. But at other frequency ranges where the tuner response changes rapidly vs. frequency, it may not do as well.

Model-based interpolation comprises a model with components whose values vary in a prescribed manner vs. tuner state and vs. frequency. The following discussion will be based on a coaxial or slab line tuner with transverse electromagnetic (TEM) fields, but can easily be applied in general to other types of transmission lines, including waveguide and non-50 Ohm TEM tuners, by persons familiar with the transmission line type to be used.

Figure 8:
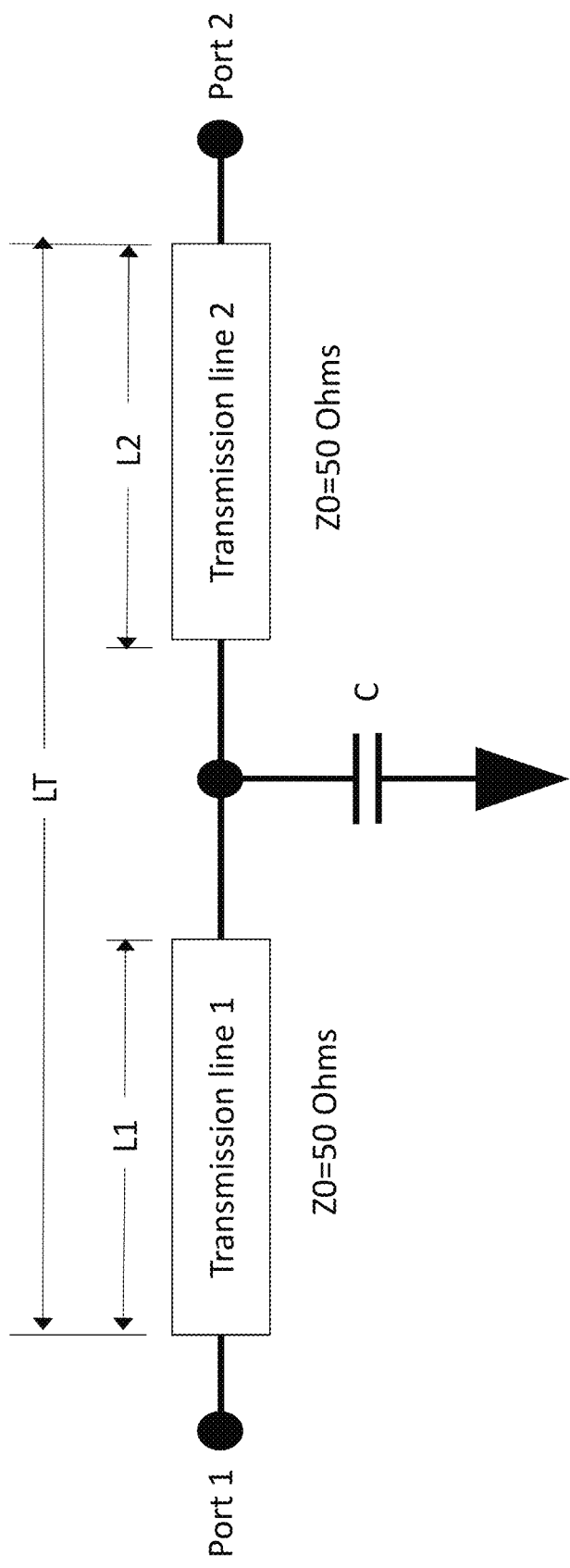
FIG. 8 shows a basic capacitive model of a tuner.

A capacitance model of a tuner is shown in FIG. 8. The length of the tuner comprises transmission line 1 and transmission line 2, which have lengths L1 and L2, respectively. The characteristic impedance of both lines is 50 Ohms. The total length of the tuner is a constant LT, where L1+L2=LT. The capacitor C represents the mismatch probe. When the probe is retracted, C goes to zero (or nearly so). As the probe is lowered toward the center conductor, C increases and reaches a maximum when the probe is closest to the center conductor. As the probe is moved horizontally along the line to the left, transmission line 1 decreases in length while transmission line 2 increases in length so that L1+L2=LT still. As the probe is moved horizontally along the line to the right, transmission line 1 increases in length while transmission line 2 decreases in length so that L1+L2=LT still.

In FIG. 8, C is a function of the probe position and frequency. Its value vs. these two parameters is fitted to the s-parameter data at calibrated frequencies. LT is fitted to the 50 Ohm tuner state, while L1 and L2 will be determined from non-50 Ohm states.

Figure 9:
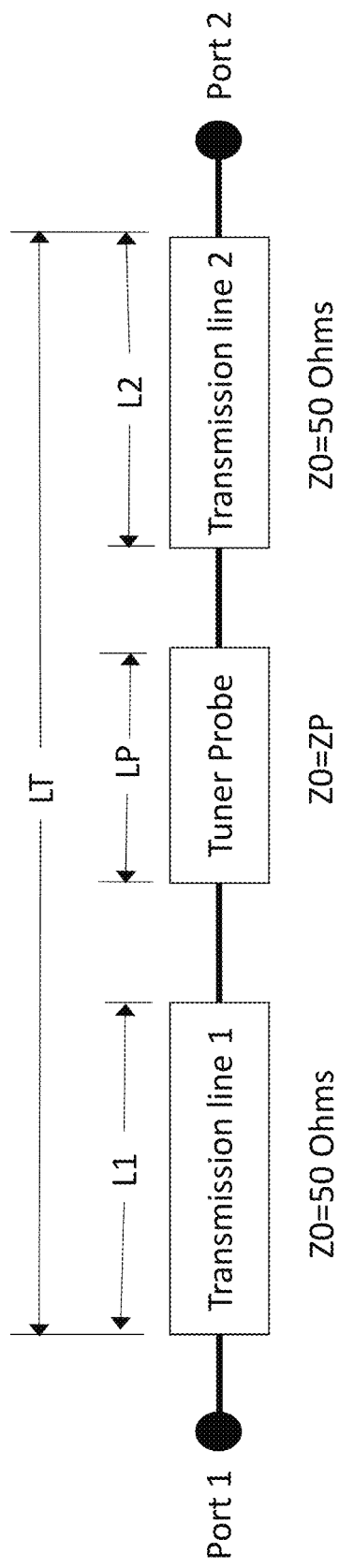
FIG. 9 shows a basic transmission line model of a tuner.

A transmission line model of a tuner is shown in FIG. 9. It comprises transmission line 1, transmission line 2, and a third transmission line which is the tuner probe. The transmission lines have lengths L1, L2, and LP, respectively. LT is the total length of the tuner, and L1, L2, and LP vary such that L1+L2+LP=LT. The characteristic impedance of both transmission line 1 and transmission line 2 is 50 Ohms.

As the tuner probe is moved horizontally along the line to the left, transmission line 1 decreases in length while transmission line 2 increases in length so that L1+L2+LP=LT still. As the probe is moved horizontally along the line to the right, transmission line 1 increases in length while transmission line 2 decreases in length so that L1+L2+LP=LT still.

As the tuner probe move vertically away from or towards the center conductor, its characteristic impedance ZP varies. When the probe is fully retracted, ZP=50 Ohms (or nearly so). As the probe is lowered toward the center conductor, ZP decreases to a minimum value when the probe is at its closest proximity to the center conductor. This minimum value depends on the specific tuner, but may be around 7 Ohms, for example.

Figure 10:
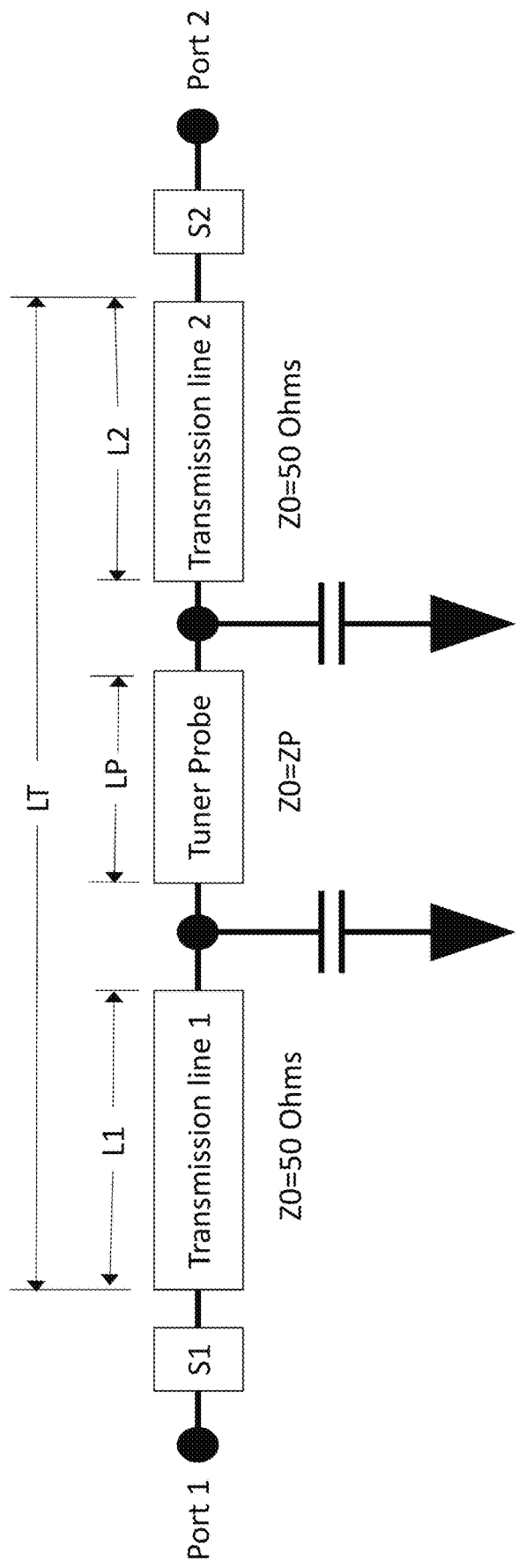
FIG. 10 shows a basic transmission line model of a tuner with some refinements added.

As the probe approaches the center conductor, the end capacitance makes LP appear to be a bit longer. This secondary effect can be accounted for by letting LP vary with the vertical position of the tuner probe. An alternate approach is to add end capacitors to the model, as shown in FIG. 10, where their values vary with the vertical probe position. Since this is a secondary effect, either way should have similar results.

Another refinement would be to let LP=LP0+LPV, where LP0 is the length when the probe is retracted and LPV is the variable part of the probe length model. Then LT=L1+L2+LP0.

One limitation of this model is fixed mismatches that are not due to the tuner probe. Examples could come from coaxial beads supporting the center conductor, or transitions from coaxial line to slab lines. A further refinement of this model would be to model these fixed mismatches with s-parameter blocks on either end of the tuner, shown as S1 and S2 in FIG. 10.

Regardless of which tuner model is used, the model parameters are fitted to match the tuner s-parameters in the calibration data vs. tuner state and frequency. This modeling may be based on a set or subset of calibration frequencies that cover a narrow frequency range for best accuracy, or a wide frequency range for the most flexibility.

Once the model parameters have been determined, the model may be used in place of calibration data at uncalibrated frequencies.

Figure 11:
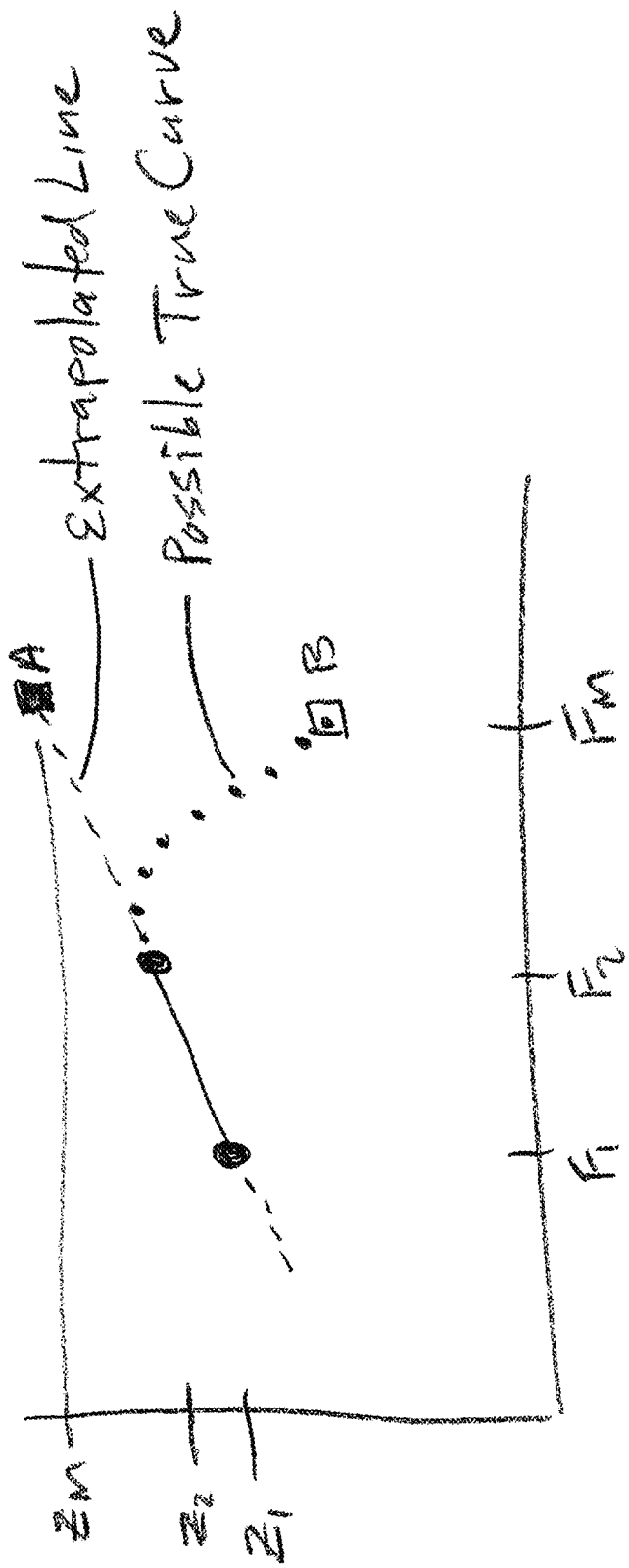
FIG. 11 shows an example of linear extrapolation.

In general, numeric interpolation works best between calibrated frequencies when the spacing between calibrated frequencies is small. Numeric extrapolation can very easily produce incorrect results because the tuner response vs. frequency often changes direction from increasing mismatch vs. frequency to decreasing mismatch, or vice versa, as illustrated in FIG. 11.

Model-based interpolation can be used over wider bands, and model-based extrapolation may work reasonably well for small extrapolations, as long as the fixed mismatches are small (or determined as s-parameter blocks in the refinement mentioned above), and the calibration data is wideband enough to model the repetitive peaks and valleys shown in FIG. 5. If extrapolation is used, a model-based approach is likely to be more accurate than the numeric approach.

Extrapolation vs. frequency includes determining calibration values at frequencies outside of the range of calibrated frequencies. This generally would use the values of multiple calibrated frequency points to determine the slope or curve, and then extend that slope or curve to a point outside the calibrated range. For example, FIG. 11 shows two calibrated points with values Z1 at F1, and Z2 at F2. A straight line between those two is extended to the right with the extrapolated line to frequency Fm, and the vertical value at Fm (square A) then gives Zm. This assumes that the straight line continues. But since there are no measurements higher than F2, the actual shape is unknown, and a possible true curve could bend down to square B, giving a significant error. In this application, Z1, Z2, Zm may represent a scalar value of an s-parameter, in which the scalar value may be, for example, a real or imaginary component of the s-parameter.

If the tuner response in the extrapolated frequency range is expected to be a good continuation of the calibrated frequency range, extrapolation could be a reasonable approach. But extrapolation should be used with caution, and interpolation is generally preferred, unless there is no choice.

When interpolation or extrapolation of tuner data vs. frequency is to be used, the data may be calculated by the controller 70 each time a new point is needed. The added calculations, compared to working at a calibrated frequency, will add some time to the process, but in many cases the extra time may be insignificant. However, if many points will need to be interpolated (or extrapolated), and especially if they need to be calculated repeatedly, it may be worthwhile to pre-calculate a number of tuner points at an uncalibrated frequency once, and this calculated data stored in memory or in a file. This will effectively create a new calibrated frequency with data that can be used in the same manner as data at frequencies that were originally calibrated. This pre-calculation may be done by the controller 70 in the measurement setup, or it could be done in advance on any computer before the measurement is setup.

Although the foregoing has been a description and illustration of specific embodiments of the subject matter, various modifications and changes thereto can be made by persons skilled in the art without departing from the scope and spirit of the invention.

What is claimed is:

1. A tuner system for conducting measurements on a Device Under Test (DUT), comprising:
    at least one passive tuner including a tuner transmission line and at least one capacitive probe which is movable axially along the tuner transmission line;
    calibration data for the at least one passive tuner comprising a set of s-parameters at a set of calibration frequencies,
    where a measurement on the DUT is done at a non-calibrated measurement frequency at which the said at least one passive tuner is not calibrated; and
    wherein the tuner s-parameters at said measurement frequency are determined by interpolation between or extrapolation from the s-parameters at said calibration frequencies; and wherein calibration data at the non-calibrated measurement frequency is determined by model-based interpolation or extrapolation comprising a model with components whose values vary in a prescribed manner versus tuner state and versus frequency, wherein said model-based interpolation or extrapolation employs a capacitance model of a tuner or said model-based interpolation or extrapolation employs a transmission line model of a tuner.

2. The tuner system of claim 1 wherein said model-based interpolation or extrapolation employs a capacitance model of a tuner.

3. The tuner system of claim 1 wherein said model-based interpolation or extrapolation employs a transmission line model of a tuner.

4. A tuner system for conducting measurements on a Device Under Test (DUT) having an input and an output, comprising:
   an RF source for generating signals to drive the DUT input;
   a controller;
   at least one passive tuner including a tuner transmission line and at least one capacitive probe which is movable axially along the tuner transmission line;
   calibration data for the at least one passive tuner comprising a set of s-parameters at a set of calibration frequencies,
   a digital memory for storing said calibration data;
   a measurement device coupled to the DUT output;
   where the controller is configured to control the RF source and the at least one passive tuner to conduct a measurement on the DUT at a non-calibrated measurement frequency at which said at least one passive tuner is not calibrated; and
   wherein the tuner s-parameters at said non-calibrated measurement frequency are determined by interpolation between or extrapolation from the s-parameters at said calibration frequencies; and
   wherein calibration data at the non-calibrated measurement frequency is determined by model-based interpolation or extrapolation comprising a model with components whose values vary in a prescribed manner versus tuner state and versus frequency, wherein said model-based interpolation or extrapolation employs a capacitance model of a tuner or said model-based interpolation or extrapolation employs a transmission line model of a tuner.

5. The tuner system of claim 4 wherein said model-based interpolation or extrapolation employs a capacitance model of a tuner.

6. The tuner system of claim 4 wherein said model-based interpolation or extrapolation employs a transmission line model of a tuner.

* * * * *